US011778861B2

(12) United States Patent
Park et al.

(10) Patent No.: US 11,778,861 B2
(45) Date of Patent: Oct. 3, 2023

(54) DISPLAY PANEL THAT INCLUDES DISPLAY AREA FACING FRONT OF WINDOW, WHERE EMISSION AREAS OF CORNER DISPLAY AREA ARE PLACED, AND DISPLAY DEVICE INCLUDING THE SAME

(71) Applicant: SAMSUNG DISPLAY CO., LTD., Yongin-si (KR)

(72) Inventors: Juchan Park, Seoul (KR); Sunho Kim, Seongnam-si (KR); Joohee Jeon, Hwaseong-si (KR); Sungjin Hong, Seoul (KR); Taehoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 17/316,722

(22) Filed: May 11, 2021

(65) Prior Publication Data

US 2022/0013611 A1 Jan. 13, 2022

(30) Foreign Application Priority Data

Jul. 8, 2020 (KR) .......................... 10-2020-0084251

(51) Int. Cl.
*H01L 29/18* (2006.01)
*H10K 59/121* (2023.01)
(Continued)

(52) U.S. Cl.
CPC ....... *H10K 59/1213* (2023.02); *H01L 27/156* (2013.01); *H01L 27/1214* (2013.01); *H10K 50/84* (2023.02); *H10K 59/352* (2023.02)

(58) Field of Classification Search
CPC ............. H01L 27/3262; H01L 27/3216; H01L 27/1214; H01L 27/156; H01L 51/5237
(Continued)

(56) References Cited

U.S. PATENT DOCUMENTS 9,489,882 B2 11/2016 Kim et al.
10,797,084 B2 10/2020 Lee et al.
(Continued)

FOREIGN PATENT DOCUMENTS

KR 20150007872 A * 1/2015 ......... H01L 51/5281
KR 20170039032 A * 4/2017 ......... H01L 27/3262
(Continued)

*Primary Examiner* — Phuc T Dang
(74) *Attorney, Agent, or Firm* — H.C. Park & Associates, PLC

(57) ABSTRACT

A display device includes: a window including a front area and a side area bent from the front area, the side area having a first curvature; and a display panel including a first display area facing the front area of the window and a second display area facing the side area of the window, the first display area including first, second, and third light emission areas, the second display area including the first, second, and third light emission areas. The second display area comprises an edge display area and a corner display area disposed at an end of the edge display area, and the first light emission area, the second light emission area, and the third light emission area of the corner display area are disposed in a stair shape along a curved edge of the corner display area.

20 Claims, 14 Drawing Sheets

(51) Int. Cl.
*H01L 27/15* (2006.01)
*H01L 27/12* (2006.01)
*H10K 50/84* (2023.01)
*H10K 59/35* (2023.01)

(58) Field of Classification Search
USPC .......................................................... 257/88
See application file for complete search history.

(56) References Cited

U.S. PATENT DOCUMENTS

| | | |
|---|---|---|
| 2018/0138256 A1 | 5/2018 | Han et al. |
| 2019/0131365 A1* | 5/2019 | Jung .................... H01L 27/3246 |
| 2019/0198820 A1* | 6/2019 | Ko ....................... H01L 27/3225 |
| 2019/0393295 A1 | 12/2019 | Moy et al. |

FOREIGN PATENT DOCUMENTS

| | | |
|---|---|---|
| KR | 10-1878189 | 7/2018 |
| KR | 10-2018-0137639 | 12/2018 |
| KR | 10-1962860 | 3/2019 |

* cited by examiner

DISPLAY PANEL THAT INCLUDES DISPLAY AREA FACING FRONT OF WINDOW, WHERE EMISSION AREAS OF CORNER DISPLAY AREA ARE PLACED, AND DISPLAY DEVICE INCLUDING THE SAME

CROSS REFERENCE TO RELATED APPLICATION

This application claims priority from and the benefit of Korean Patent Application No 10-2020-0084251, filed on Jul. 8, 2020, which is hereby incorporated by reference for all purposes as if fully set forth herein.

BACKGROUND

Field

Exemplary implementations of the invention relate generally to a display panel and a display device, and more particularly, to a display panel including an area having a curvature and a display device including the display panel.

Discussion of the Background

Multimedia electronic devices such as televisions, mobile phones, tablet computers, navigators, game consoles, and the like include a display device for displaying an image.

Recently, studies on reduction of a non-display area of a display device, on which an image is not displayed, have been conducted according to demands of the markets. In addition, studies on expansion of a display area of a display device, on which an image is displayed, have been conducted.

The above information disclosed in this Background section is only for understanding of the background of the inventive concepts, and, therefore, it may contain information that does not constitute prior art.

SUMMARY

Applicant discovered that a display device with a curvature may display a distorted image in the curvature thereof.

Display devices with a curvature constructed according to the principles and exemplary implementations of the invention are capable of improving image quality by minimizing distortion of an image displayed in the curvature.

Additional features of the inventive concepts will be set forth in the description which follows, and in part will be apparent from the description, or may be learned by practice of the inventive concepts.

According to one aspect of the invention, a display device includes: a window including a front area and a side area bent from the front area, the side area having a first curvature; and a display panel including a first display area facing the front area of the window and a second display area facing the side area of the window, the first display area including a first light emission area, a second light emission area, and a third light emission area, the second display area including the first light emission area, the second light emission area, and the third light emission area, wherein the second display area comprises an edge display area and a corner display area disposed at an end of the edge display area, and the first light emission area, the second light emission area, and the third light emission area of the corner display area are disposed in a stair shape along a curved edge of the corner display area.

The first light emission area of the second display area may have a surface area greater than that of the first light emission area of the first display area, the second light emission area of the second display area may have a surface area greater than that of the second light emission area of the first display area, and the third light emission area of the second display area may have a surface area greater than that of the third light emission area of the first display area.

The second display area may include a first sub area adjacent to the first display area and a second sub area adjacent to the first sub area.

The display panel may further include a driving driver disposed on the second display area, and a portion of the second sub area overlaps the driving driver in a plan view.

The display panel may further include: first light emitting elements and first driving circuits configured to control the first, second, and third light emission areas of the first display area; and second light emitting elements and second driving circuits configured to control the first, second, and third light emission areas of the second display area, wherein the second driving circuits may be disposed on the first sub area.

The first, second, and the third light emission areas of the second sub area inside the second display area may overlap the driving driver in a plan view.

Each of the second driving circuits may have a surface area greater than that of each of the first driving circuits.

A width of the corner display area in a first direction inside the second display area may be gradually narrowed as moving from the edge display area in a second direction intersecting the first direction.

A width of the corner display area in a first direction inside the second display area may be substantially constant as moving in a second direction intersecting the first direction, and a width of a portion of the first display area overlapping the side area of the window in the first direction may be gradually narrowed as moving in the second direction.

According to another aspect of the invention, a display device include: a window including a front area and a side area bent from the front area, the side area having a first curvature; and a display panel on the window, the display panel including a first display area facing the front area of the window and a second display area facing the side area of the window, the second display area including an edge display area and a corner display area disposed on at an end of the edge display area, wherein: the first display area comprises a plurality of first unit areas, each of the first unit areas including a first light emission area, a second light emission area, and a third light emission area, and the second display area comprises a plurality of second unit areas, each of the second unit areas including the first light emission area, the second light emission area, and the third light emission area, and wherein: each of the plurality of second unit areas has a surface area greater than that of each of the plurality of first unit areas, and the plurality of second unit areas are disposed in a stair shape along a curved edge of the corner display area.

The second display area may include a first sub area adjacent to the first display area and a second sub area adjacent to the first sub area.

The display panel may further include a driving driver disposed on the second display area, and a portion of the second sub area may overlap the driving driver in a plan view.

A width of the corner display area in a first direction inside the second display area may be gradually narrowed as moving from the edge display area in a second direction intersecting the first direction.

A width of the corner display area in a first direction inside the second display area may be substantially constant as moving in a second direction intersecting the first direction, and a width of a portion of the first display area overlapping the side area of the window in the first direction may be gradually narrowed as moving in the second direction.

Each of the plurality of first unit areas and the plurality of second unit areas may further include a fourth light emission area.

Two light emission areas of the first, second, third, and fourth light emission areas of each of the plurality of first unit areas and the plurality of second unit areas may generate light having a substantially same color.

According to another aspect of the invention, a display panel includes: a first display area including a plurality of first unit areas, each of the plurality of first unit areas including a first light emission area, a second light emission area, and a third light emission area; and a second display area adjacent to the first display area, the second display area including an edge display area and a corner display area disposed in at an end of the edge display area, wherein: the second display area comprises a plurality of second unit areas, each of the plurality of second unit areas including the first light emission area, the second light emission area, and the third light emission area, each of the plurality of second unit areas has a surface area greater than that of each of the plurality of first unit areas, and the plurality of second unit areas are disposed in a stair shape along a curved edge of the corner display area.

The second display area may include a first sub area adjacent to the first display area and a second sub area adjacent to the first sub area.

The display panel of claim may further include: first light emitting elements and second driving circuits configured to control the first, second, and third light emission areas of the first display area; and second light emitting elements and second driving circuits configured to control the first, second, and third light emission areas of the second display area, wherein the second driving circuits may be disposed on the first sub area.

A width of the corner display area in a first direction inside the second display area may be substantially constant as moving in a second direction intersecting the first direction, and a width of a portion of the first display area adjacent to the second display area in the first direction may be gradually narrowed as moving in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
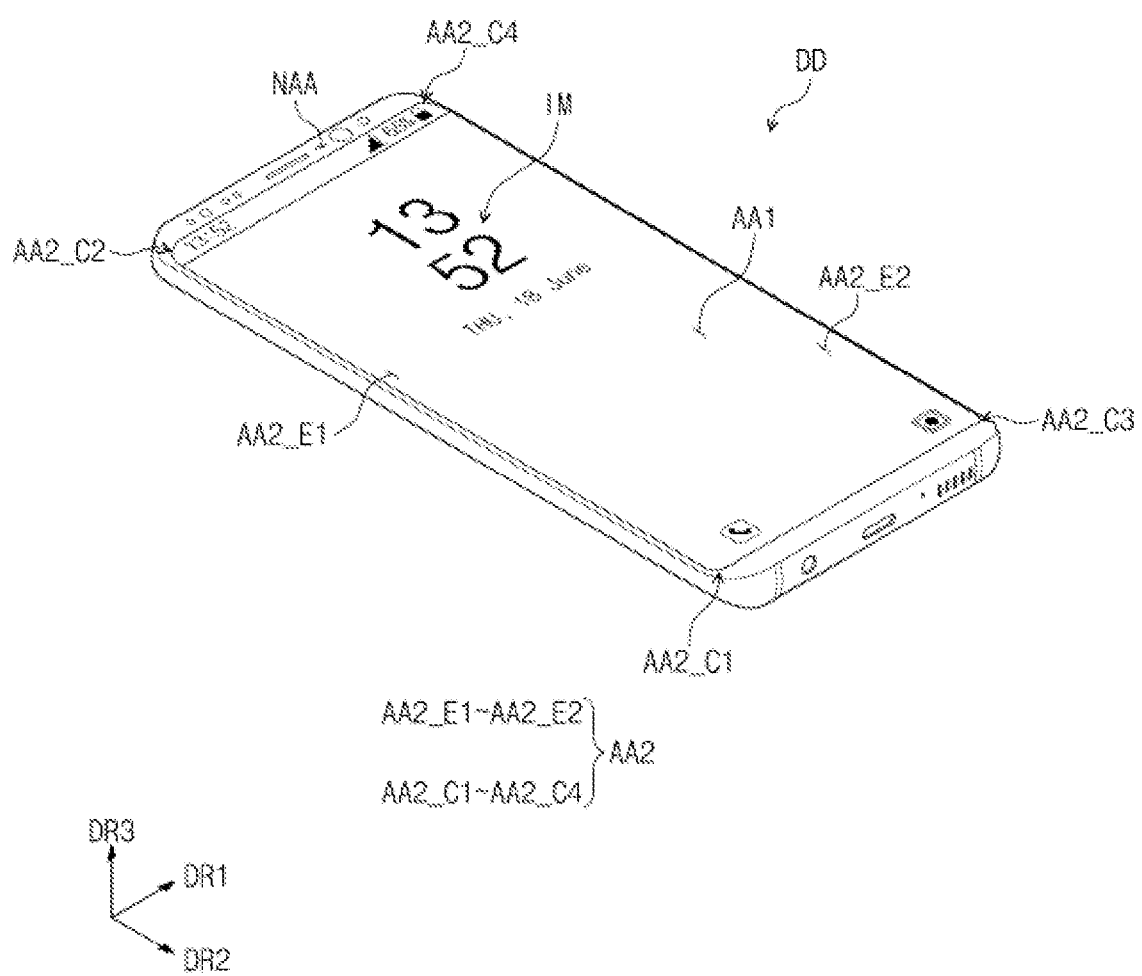
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concept will be described with reference to the accompanying drawings.

Figure 2:
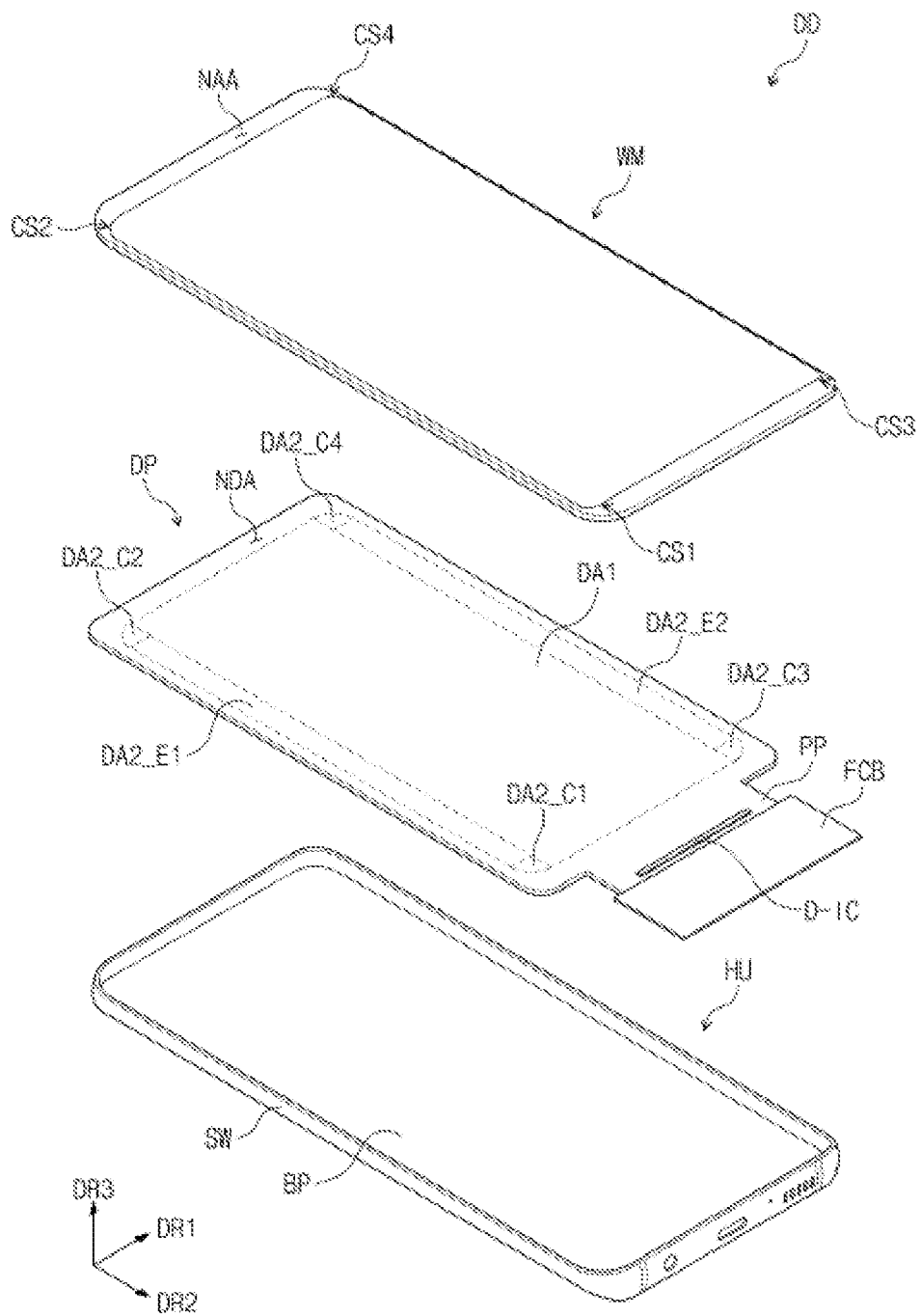
FIG. 2 is an exploded perspective view of the display device of FIG. 1.
Figure 3:
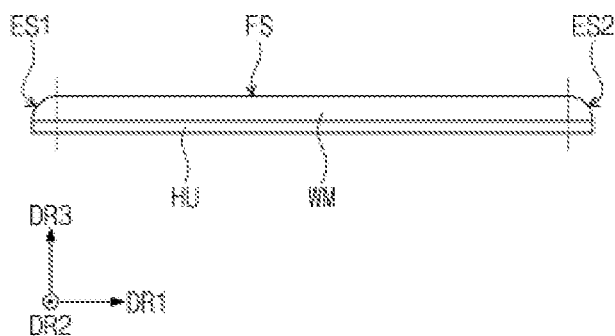
FIG. 3 is a side view of the display device of FIG. 1.

FIG. 1 is a perspective view of an exemplary embodiment of a display device constructed according to the principles of the invention. FIG. 2 is an exploded perspective view of the display device of FIG. 1. FIG. 3 is a side view of the display device of FIG. 1 when viewed in a second direction.

FIGS. 1, 2 and 3 illustrate that the display device DD is a mobile phone. However, exemplary embodiments are not limited thereto. For example, the display device DD may be a large-sized electronic device such as a television or a monitor, as well as a small and medium-sized electronic device such as a tablet, a notebook computer, a car navigation system, a game console, or a smart watch.

Referring to FIG. 1, the display device DD may include active areas AA1 and AA2 on which an image IM is displayed and a peripheral area NAA on which the image IM is not displayed. In FIG. 1, the image IM is illustrated as a date and a time image.

The active areas AA1 and AA2 may include a first active area AA1 having a planar shape and a second active area AA2 bent from the first active area AA1. The second active area AA2 may be an area bent from the first active area AA1 at a predetermined curvature. However, exemplary embodiments are not limited to the shape of the second active area AA2. For example, the second active area AA2 may be bent from the first active area AA1 and may have a planar shape that is inclined with respect to or substantially perpendicular to the first active area AA1. The first and second active areas AA1 and AA2 may be only figuratively divided areas and may substantially implement one display surface. The peripheral area NAA may be an area on which the image IM is not displayed. A bezel area of the display device DD may be defined by the peripheral area NAA. Also, an image may not be displayed on a partial area of the second active area AA2. For example, the bezel area may be defined along an edge of the second active area AA2.

The first active area AA1 is substantially parallel to a plane defined by a first direction DR1 and a second direction DR2. A normal direction of the first active area AA1, i.e., a thickness direction of the display device DD may be substantially parallel to a third direction DR3. A front surface (e.g., top surface) and a rear surface (e.g., bottom surface) of each of members of the display device DD are distinguished by the third direction DR3. However, directions indicated as the first to third direction DR1, DR2, and DR3 may be a relative concept and thus changed into different directions.

The second active area AA2 may be an area that is bent from the first active area AA1 to extend. The second active area AA2 includes edge active areas AA2_E1 and AA2_E2 bent from sides of the first active area AA1 and corner active areas AA2_C1, AA2_C2, AA2_C3, and AA2_C4 bent from corners of the first active area AA1. The second active area AA2 includes a first edge active area AA2_E1 bent from a first side of the first active area AA1 and a second edge active area AA2_E2 bent from a second side of the first active area AA1. For example, the first side and the second side of the first active area AA1 may be a long side, and be opposite to each other. The second active area AA2 includes a first corner active area AA2_C1 bent from a first corner of the first active area AA1, a second corner active area AA2_C2 bent from a second corner of the first active area AA1, a third corner active area AA2_C3 bent from a third corner of the first active area AA1, and a fourth corner active area AA2_C4 bent from a fourth corner of the first active area AA1.

The first corner active area AA2_C1 is disposed at one end of the first edge active area AA2_E1, and the second corner active area AA2_C2 is disposed at the other end of the first edge active area AA2_E1. The third corner active area AA2_C3 is disposed at one end of the second edge active area AA2_E2, and the fourth corner active area AA2_C4 is disposed at the other end of the second edge active area AA2_E2.

The number of edge active areas AA2_E1 and AA2_E2 and the number of corner active areas AA2_C1 to AA2_C4 are not limited thereto. For example, the number of edge active areas AA2_E1 and AA2_E2 and the number of corner active areas AA2_C1 to AA2_C4, which are provided in the second active area AA2, may vary according to the shape of the first active area AA1. For example, the display device DD may further include second active areas that are bent from a short side of the first active area AA1 to extend.

Each of the first and second edge active areas AA2_E1 and AA2_E2 may be bent at a predetermined curvature in the third direction DR3. Each of the first and second edge active areas AA2_E1 and AA2_E2 may have a short curved shape. Also, each of the first, second, third, and fourth corner active areas AA2_C1, AA2_C2, AA2_C3, and AA2_C4 may be bent at a predetermined curvature in the third direction DR3. Each of the first, second, third, and fourth corner active areas AA2_C1, AA2_C2, AA2_C3, and AA2_C4 may have a double curved shape.

In an exemplary embodiment, a first image displayed on the first active area AA1 and a second image displayed on the second active area AA2 may be dependent on each other. For example, one picture, a scene of a movie, or a UI/UX design may be formed by a combination of the first image and the second image. The display device DD may be improved in aesthetic feeling by the second active area AA2 bent at a predetermined curvature, and the peripheral area NAA recognized by the user may be reduced in surface area.

Referring to FIG. 2, the display device DD may include a window WM, a display panel DP, and a housing HU. The window WM protects a top surface of the display panel DP. The window WM may be optically transparent. Thus, the image displayed on the display panel DP may pass through the window WM and be visually recognized by the user. For example, the display surface of the display device DD may be defined by the window WM. The window WM may be made of glass, plastic, film, or the like.

Referring to FIG. 3, the window WM may have a curved structure. The window WM may include a front surface FS and one or more curved surfaces (e.g., side areas) bent from the front surface. Here, the front surface FS and at least one curved surface may be defined as transmission portions that transmits an image or light. The front surface FS of the window WM may define the first active area AA1 (e.g., in FIG. 1) of the display device DD, and the at least one curved surface may define the second active area AA2 (e.g., in FIG. 1).

In the exemplary embodiment illustrated in FIG. 3, the window WM may include two curved surfaces, e.g., a first curved surface ES1 and a second curved surface ES2. In this exemplary embodiment, the front surface FS may be a plane defined by the first direction DR1 and the second direction DR2. The front surface FS may be substantially perpendicular to the third direction DR3. Each of the first and second curved surfaces ES1 and ES2 is bent from the front surface FS.

Each of the first curved surface ES1 and the second curved surface ES2 is bent from the front surface FS. The first and second curved surfaces ES1 and ES2 may be bent from first and second sides of the front surface FS, respectively. The first and second sides of the front surface FS may be substantially parallel to the second direction DR2. The first curved surface ES1 and the second curved surface ES2 may be disposed in substantially parallel to each other in the second direction DR2.

Each of the first curved surface ES1 and the second curved surface ES2 may be bent from the front surface FS at a predetermined curvature. According to an exemplary embodiment, the first curved surface ES1 and the second curved surface ES2 may have the substantially same curvature.

The first corner CS1 and the second corner CS2 are disposed at one end and the other end of the first curved surface ES1, respectively. The third corner CS3 and the fourth corner CS4 are disposed at one end and the other end of the second curved surface ES2, respectively. Here, each of the first, second, third, and fourth corners CS1, CS2, CS3, and CS4 may be defined as a transmission portion that transmits an image or light.

Figure 4:
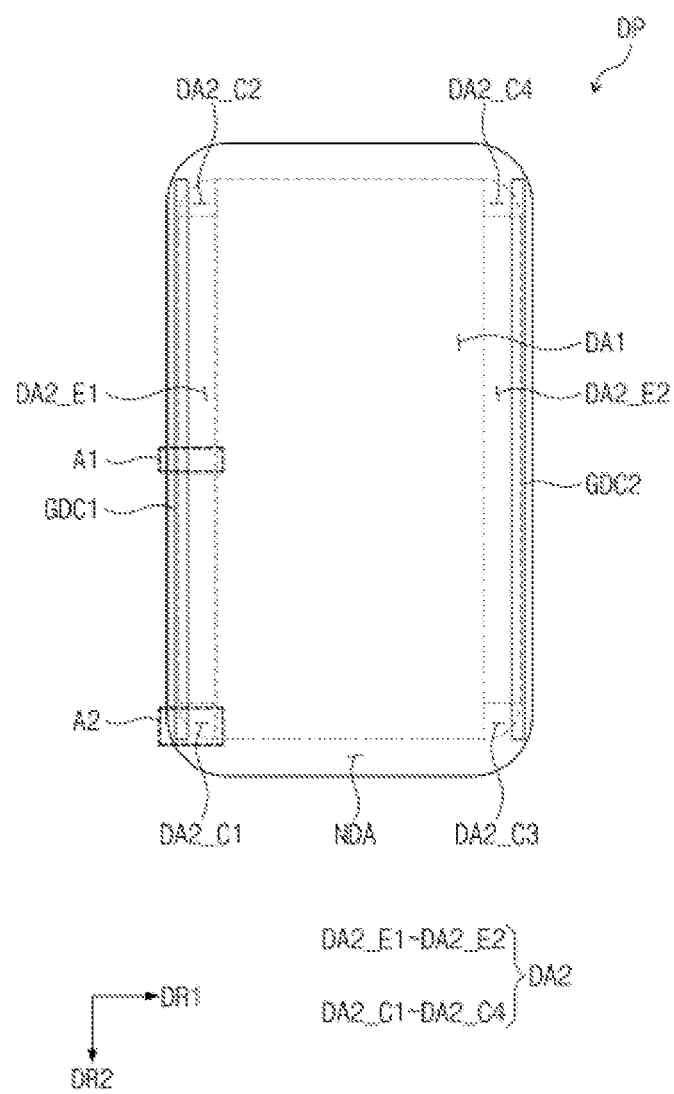
FIG. 4 is a plan view of the display device of FIG. 1.

FIG. 4 is a plan view of the display panel according to an exemplary embodiment.

Referring to FIGS. 2, 3 and 4, the display panel DP may include a display area for displaying an image. According to an exemplary embodiment, the display area may include a first display area DA1 and a second display area DA2. The first display area DA1 may be disposed in substantially parallel to the front surface FS of the window WM and may have a shape corresponding to the front surface FS. For example, the first display area DA1 may be a flat display area having a planar shape. The second display area DA2 is disposed to correspond to one or more curved surfaces and one or more corners. The second display area DA2 may have a curved shape corresponding to at least one curved surface and at least one corner.

The second display area DA2 includes first, second, third, and fourth corner display areas DA2_C1, DA2_C2, DA2_C3, and DA2_C4, which are disposed to correspond to the first, second, third, and fourth corner active areas AA2_C1, AA2_C2, AA2_C3, and AA2_C4, respectively. The first and second edge display areas DA2_E1 and DA2_E2 may be bent from the first and second sides of the first display area DA1 and disposed to correspond to the first and second curved surfaces ES1 and ES2 of the window WM, respectively. The first and second sides of the first display area DA1 extend substantially parallel to the second direction DR2. Each of the first and second edge display areas DA2_E1 and DA2_E2 may have a predetermined curvature and be bent from the first display area DA1.

Although the structure in which the second display area DA2 includes two edge display areas DA2_E1 and DA2_E2 in the display panel DP according to an exemplary embodiment has been described above, the structure of the display panel DP according to the exemplary embodiment is not limited thereto. For example, the second display area DA2 of the display panel DP may include only one edge display area or only two edge display areas provided on the third and fourth sides of the first display area DA1. Also, the second display area DA2 of the display panel DP may include four edge display areas provided on all of the first, second, third, and fourth sides of the first display area DA1.

The second display area DA2 may further include first, second, third, and fourth corner display areas DA2_C1, DA2_C2, DA2_C3, and DA2_C4, which are disposed to correspond to the first, second, third, and fourth corners CS1, CS2, and CS3, and CS4 of the window WM, respectively. The first corner display area DA2_C1 and the second corner display area DA2_C2 are disposed at one end and the other end of the first edge display area DA2_E1, respectively. The third corner display area DA2_C3 and the fourth corner display area DA2_C4 are disposed at one end and the other end of the second edge display area DA2_E2, respectively. The first, second, third, and fourth corner display areas DA2_C1, DA2_C2, DA2_C3, and DA2_C4 may be areas on which an image is substantially displayed. However, exemplary embodiments are not limited thereto. According to another exemplary embodiment, the first, second, third, and fourth corner display areas DA2_C1, DA2_C2, DA2_C3, and DA2_C4 may be areas that do not display an image, and only some of the first, second, third, and fourth corner display areas DA2_C1, DA2_C2, DA2_C3, and DA2_C4 may display an image.

The display panel DP may include pixels disposed on the first display area DA1 and pixels disposed on the second display area DA2. Each of the pixels may include a light emitting element and a driving circuit connected to the light emitting element.

The display panel DP may further include driving drivers GDC1 and GDC2. The driving drivers GDC1 and GDC2 may include a first driving driver GDC1 and a second driving driver GDC2. Each of the first and second driving drivers GDC1 and GDC2 may generate a plurality of scan signals and a plurality of emission control signals, and may output the generated signals to corresponding pixels.

The display panel DP may further include a non-display area NDA around the second display area DA2. The non-display area NDA is an area on which an image is not substantially displayed. The non-display area NDA may surround the second display area DA2.

Each of the first and second driving drivers GDC1 and GDC2 may be disposed inside the second display area DA2 or may be disposed to partially overlap the second display area DA2 (e.g., in the third direction DR3 or in a plan view). When each of the first and second driving drivers GDC1 and GDC2 is disposed inside the second display area DA2, the non-display area NDA may be prevented from increasing in width by the first and second driving drivers GDC1 and GDC2. A surface area of the non-display area NDA, which is visually recognized by the user in the display device DD, may be decreased by the second display area DA2. In an exemplary embodiment, each of the first and second driving drivers GDC1 and GDC2 may be a scan driver. In an exemplary embodiment, the first driving driver GDC1 may be a scan driver for driving the scan lines, and the second driving driver GDC2 may be a light emitting driver for driving the emission control lines.

In an exemplary embodiment, the first image displayed on the first display area DA1 and the second image displayed on the second display area DA2 may be dependent on each other. For example, a picture, a scene of a movie, or a UI/UX design may be formed by a combination of the first image and the second image. However, exemplary embodiments are not limited thereto. For example, a partial display area of the second display area DA2, for example, the first, second, third, and fourth corner display areas DA2_C1, DA2_C2, DA2_C3, and DA2_C4 may display a black image that is not dependent on the first image or a predetermined pattern image.

According to an exemplary embodiment, the display panel DP may be an organic light emitting display panel, an electrophoretic display panel, or an electrowetting display panel. Also, the display panel DP may be a flexible display panel that is capable of being bent along the shape of the window WM.

Referring again to FIG. 2, the display panel DP may further include a pad area PP extending from the second display area DA2. A driving chip D-IC and pads may be disposed on the pad area PP of the display panel DP. The driving chip D-IC may provide driving signals to the first and second display areas DA1 and DA2 of the display panel DP. The driving chip D-IC may be mounted on the display panel DP. The display panel DP may be electrically connected to a printed circuit board FCB through the pads. In an exemplary embodiment, the driving chip D-IC may be mounted on the printed circuit board FCB.

The housing HU includes a bottom part BP and a sidewall SW. The sidewall SW may extend from the bottom part BP. The housing HU may accommodate the display panel DP in an accommodation space defined by the bottom part BP and the sidewall SW. The window WM may be coupled to the sidewall SW of the housing HU. The sidewall SW of the housing HU may support an edge of the window WM.

The housing HU may include a material having relatively high rigidity. For example, the housing HU may include glass, plastic, or a metal or may include a plurality of frames and/or plates made of a combination of glass, plastic, and a metal. The housing HU may stably protect constituents of the display device DD accommodated in the internal space from external impact.

Figure 5A:
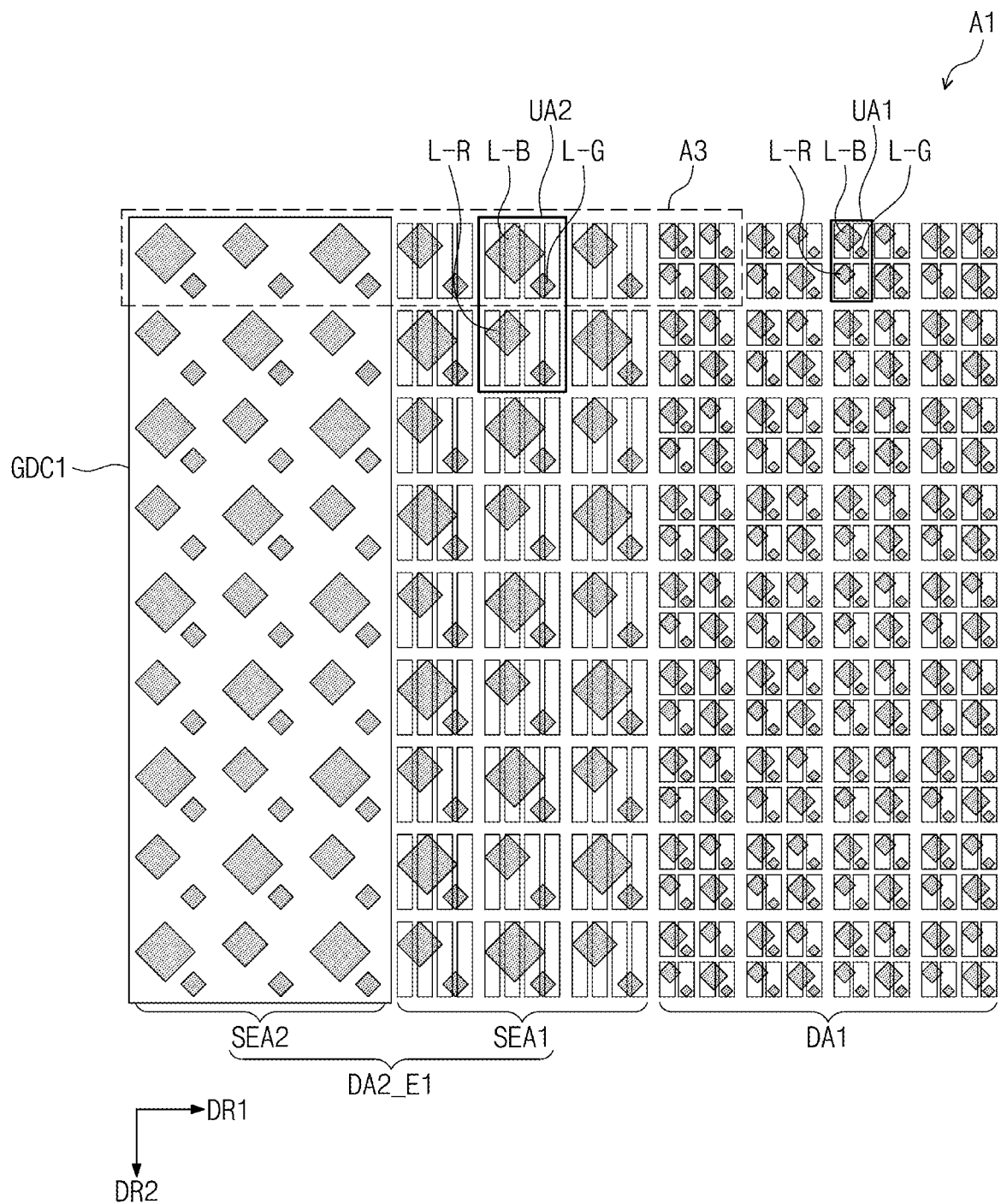
FIG. 5A is an enlarged plan view of an area A1 of FIG. 4.
Figure 5B:
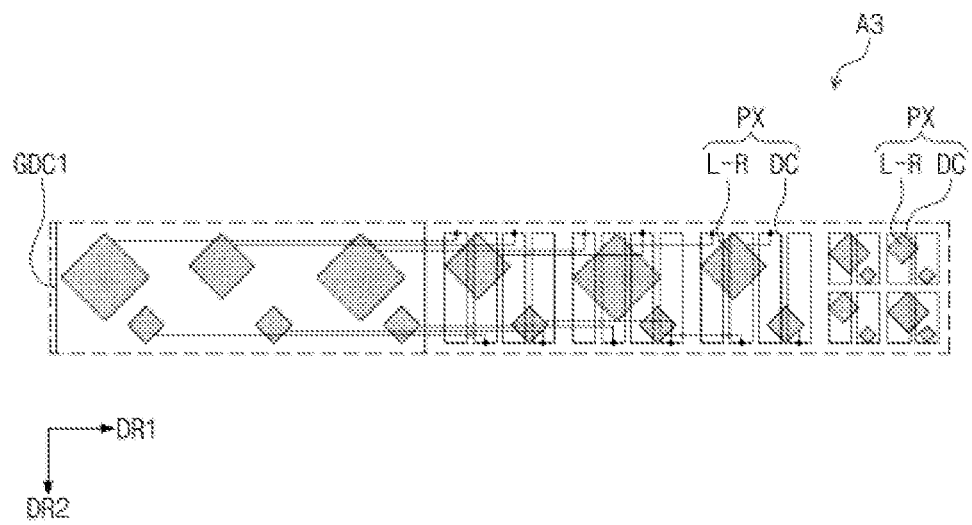
FIG. 5B is an enlarged plan view of an area A3 of FIG. 5A.
Figure 6:
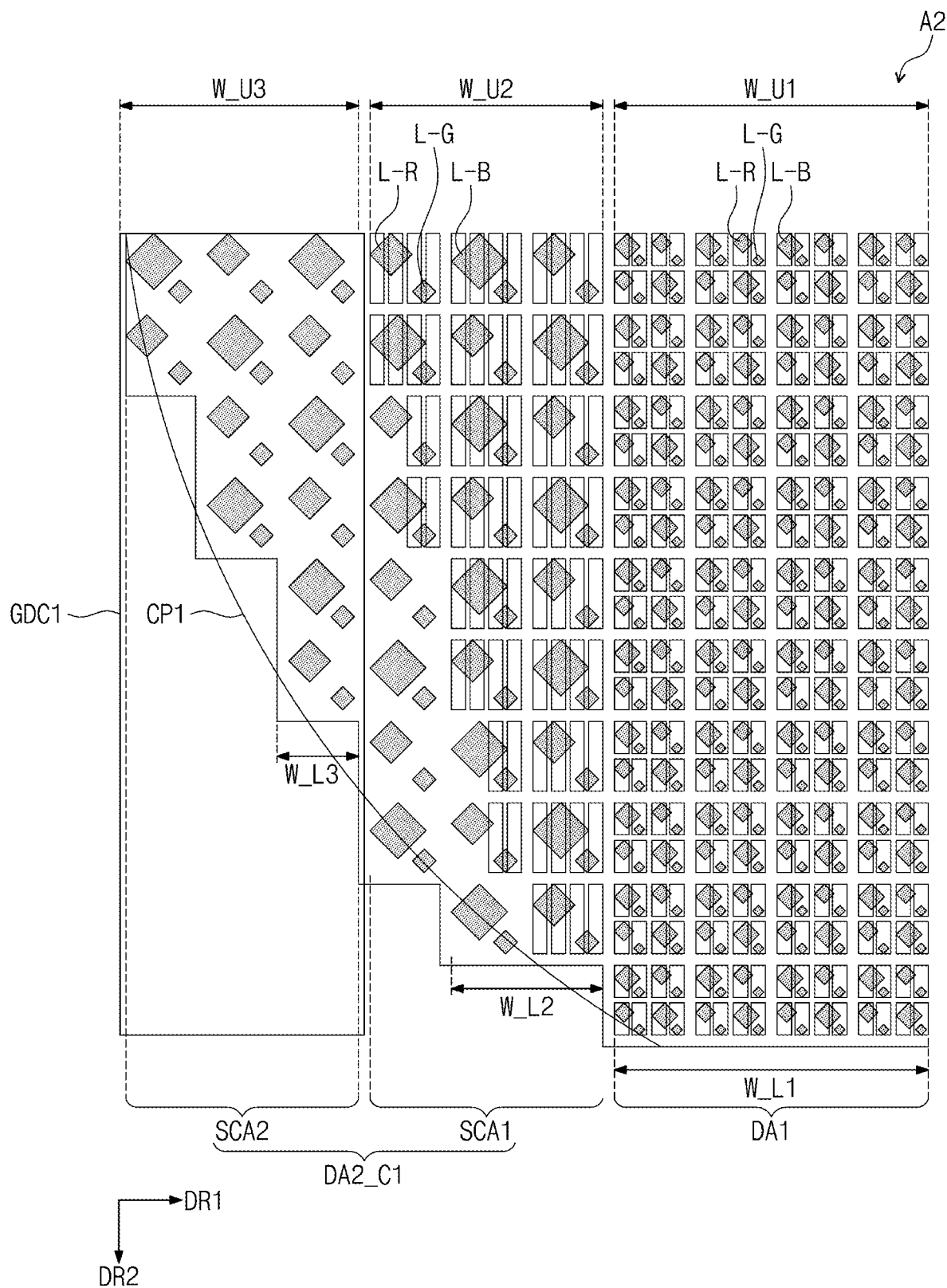
FIG. 6 is an enlarged plan view of an area A2 of FIG. 4 illustrating an exemplary embodiment of the display panel of FIG. 2.

FIG. 5A is an enlarged plan view of an area A1 of FIG. 4, and FIG. 5B is an enlarged plan view of an area A3 of FIG. 5A. FIG. 6 is an enlarged plan view of an area A2 of FIG. 4.

For example, each of the second, third, and fourth corner display areas DA2 C2, DA2 C3, and DA2 C4 may have the substantially same pixel configuration, pixel arrangement, and light emission area arrangement as a first corner display area DA2 C1 to be described later. The second edge display area DA2 E2 may have the substantially same pixel configuration, pixel arrangement, and light emission area arrangement as a first edge display area DA2 E1 to be described later.

Three types of pixels are disposed on each of the first corner display area DA2 _C1 and the first display area DA1. The three types of pixels that generate light having different colors may be defined as a first color pixel, a second color pixel, and a third color pixel. Each of the three types of pixels may include a driving circuit and a light emitting element.

FIG. 5A illustrates light emission areas L-R, L-G, and L-B of the light emitting elements. The first light emission area L-R is a light emission area of the first color pixel, the second light emission area L-G is a light emission area of the second color pixel, and the third light emission area L-B is a light emission area of the third color pixel. For example, a driving circuit DC and a light emitting diode ED (see FIG. D disposed on the first light emission area L-R may constitute one pixel PX.

Figure 7:
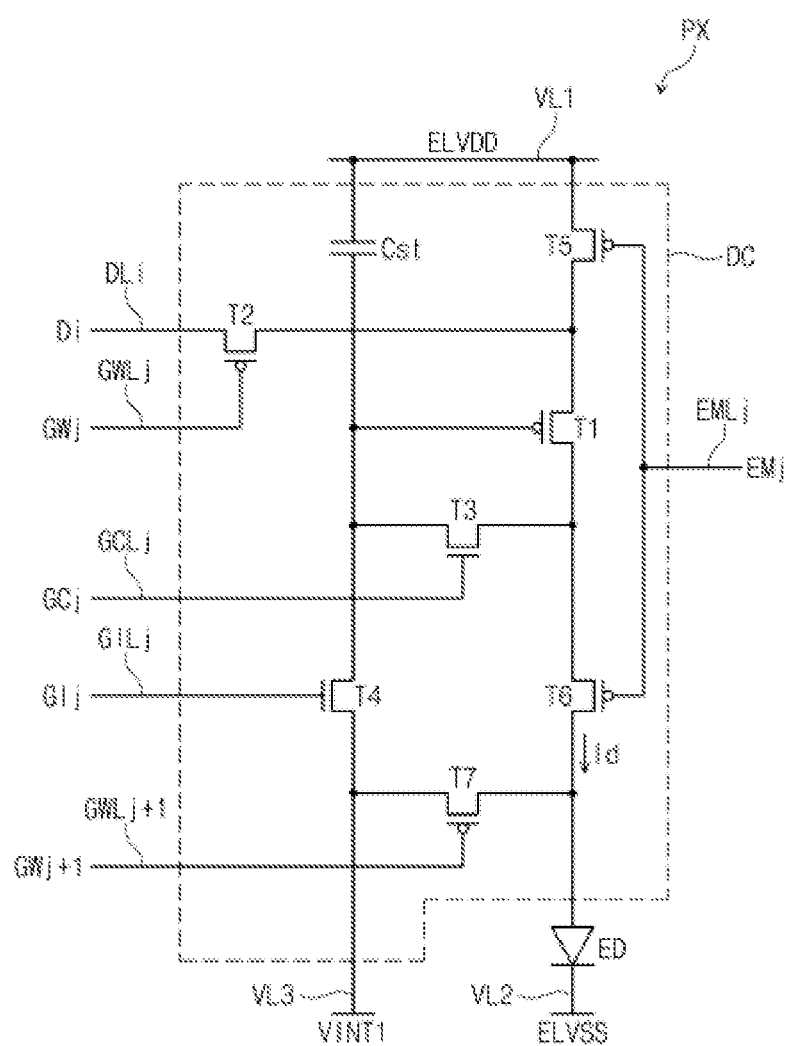
FIG. 7 is an equivalent circuit diagram of a representative pixel of a display panel of the display device of FIG. 2.

FIG. 7 is an equivalent circuit diagram of a representative pixel of the display panel DP of FIG. 2.

FIG. 7 illustrates an equivalent circuit diagram of the pixel PX connected to a data line DLi, the scan lines GCLj, GILj, GWLj, and GWLj+1, and an emission control line EMLj.

In this exemplary embodiment, the driving circuit DC of the pixel PX includes first to seventh transistors T1 to T7 and one capacitor Cst. Each of the first, second, fifth, sixth, and seventh transistors T1, T2, T5, T6, and T7 is a P-type transistor having a low-temperature polycrystalline silicon (LTPS) semiconductor layer, and each of the third and fourth transistors T3 and T4 is an N-type transistor using an oxide semiconductor as a semiconductor layer. However, exemplary embodiments are not limited thereto. For example, all of the first to seventh transistors T1 to T7 may be N-type transistors or P-type transistors. In an exemplary embodiment, at least one of the first to seventh transistors T1 to T7 may be an N-type transistor, and the other may be a P-type transistor. In addition, the driving circuit DC illustrated in FIG. 7 is merely an example, and the circuit configuration of the driving circuit DC may be modified.

Referring to FIG. 7, the pixel PX of the display device DD according to an exemplary embodiment includes at least one light emitting diode ED. In this exemplary embodiment, an example in which one pixel PX includes one light emitting diode ED is described, but exemplary embodiments are not limited thereto.

For convenience of explanation, in the description of FIG. 7, the scan line GCLj, the scan line GILj, the scan line GWLj, and the scan line GWLj+1 are referred to a first scan line GCLj, a second scan line GILj, a third scan line GWLj, and a fourth scan line GWLj+1, respectively.

The first, second, third, and fourth scan lines GCLj, GILj, GWLj, and GWLj+1 may transmit first, second, third, and fourth scan signals GCj, Glj, GWj, and GWj+1, respectively. The first scan signal GCj may turn on/off the third transistor T3. The second scan signal Glj may turn on/off the fourth transistor T4. The third scan signal GWj may turn on/off the second transistor T2. The fourth scan signal GWj+1 may turn on/off the seventh transistor T7.

The emission control line EMLj may transmit the emission control signal EMj capable of controlling luminescence of the light emitting diode ED provided in the pixel PX. The emission control signal EMj transmitted through the emission control line EMLj may have a waveform different from that of each of the first, second, third, and fourth scan signals GCj, Glj, GWj, and GWj+1. The data line DLi transfers the data signal Di. The data signal Di may have a voltage level corresponding to an image signal RGB inputted to the display device DD (see FIG. 2). First and second driving voltage lines VL1 and VL2 may transmit a first driving voltage ELVDD and a second driving voltage ELVSS, respectively.

The first transistor T1 includes a first electrode connected to the first driving voltage line VL1 via the fifth transistor T5, a second electrode electrically connected to an anode of the light emitting diode ED via the sixth transistor T6, and a gate electrode connected to one end of the capacitor Cst. The first transistor T1 may receive the data signal Di transmitted from the data line DLi according to a switching operation of the second transistor T2 to supply driving current Id to the light emitting diode ED.

The second transistor T2 includes a first electrode connected to the data line DLi, a second electrode connected to the first electrode of the first transistor T1, and a gate electrode connected to the third scan line GWLj. The second transistor T2 may be turned on according to the third scan signal GWj transmitted through the third scan line GWLj to transmit the data signal Di transmitted from the data line DLi to the first electrode of the first transistor T1.

The third transistor T3 includes a first electrode connected to the gate electrode of the first transistor T1, a second electrode connected to the second electrode of the first transistor T1, and a gate electrode connected to the first scan line GCLj. The third transistor T3 may be turned on according to the first scan signal GCj transmitted through the first scan line GCLj to connect the gate electrode of the first transistor T1 to the second electrode of the first transistor T1, thereby diode-connecting the first transistor T1.

The fourth transistor T4 includes a first electrode connected to the gate electrode of the first transistor T1, a second electrode connected to the third voltage line VL3 through which an initialization voltage VINT1 is transmitted, and a gate electrode connected to the second scan line GILj. The fourth transistor T4 may be turned on according to the second scan signal Glj transmitted through the second scan line GILj to transfer the initialization voltage VINT1 to the gate electrode of the first transistor T1, thereby performing an initialization operation for initializing a voltage of the gate electrode of the first transistor T1.

The fifth transistor T5 includes a first electrode connected to the first driving voltage line VL1, a second electrode connected to the first electrode of the first transistor T1, and a gate electrode connected to the emission control line EMLj.

The sixth transistor T6 includes a first electrode connected to the second electrode of the first transistor T1, a second electrode connected to the anode of the light emitting diode ED, and a gate electrode connected to the emission control line EMLj.

The fifth transistor T5 and the sixth transistor T6 may be turned on at the substantially same time according to the emission control signal EMj transmitted through the emission control line EMLj, and thus, the first driving voltage ELVDD may be compensated through the diode-connected first transistor T1 and be transmitted to the light emitting diode ED.

The seventh transistor T7 includes a first electrode connected to the second electrode of the fourth transistor T4, a second electrode connected to the second electrode of the sixth transistor T6, and a gate electrode connected to the fourth scan line GWLj+1.

As described above, one end of the capacitor Cst is connected to the gate electrode of the first transistor T1, and the other end of the capacitor Cst is connected to the first driving voltage line VL1. A cathode of the light emitting diode ED may be connected to the second driving voltage line VL2 that transmits the second driving voltage ELVSS. The structure of the pixel PX according to the exemplary embodiment is not limited to the structure illustrated in FIG.

3, and the number of each of transistors and capacitors, which are provided in one pixel PX, and the connection relationships therebetween may be variously modified.

Figure 8:
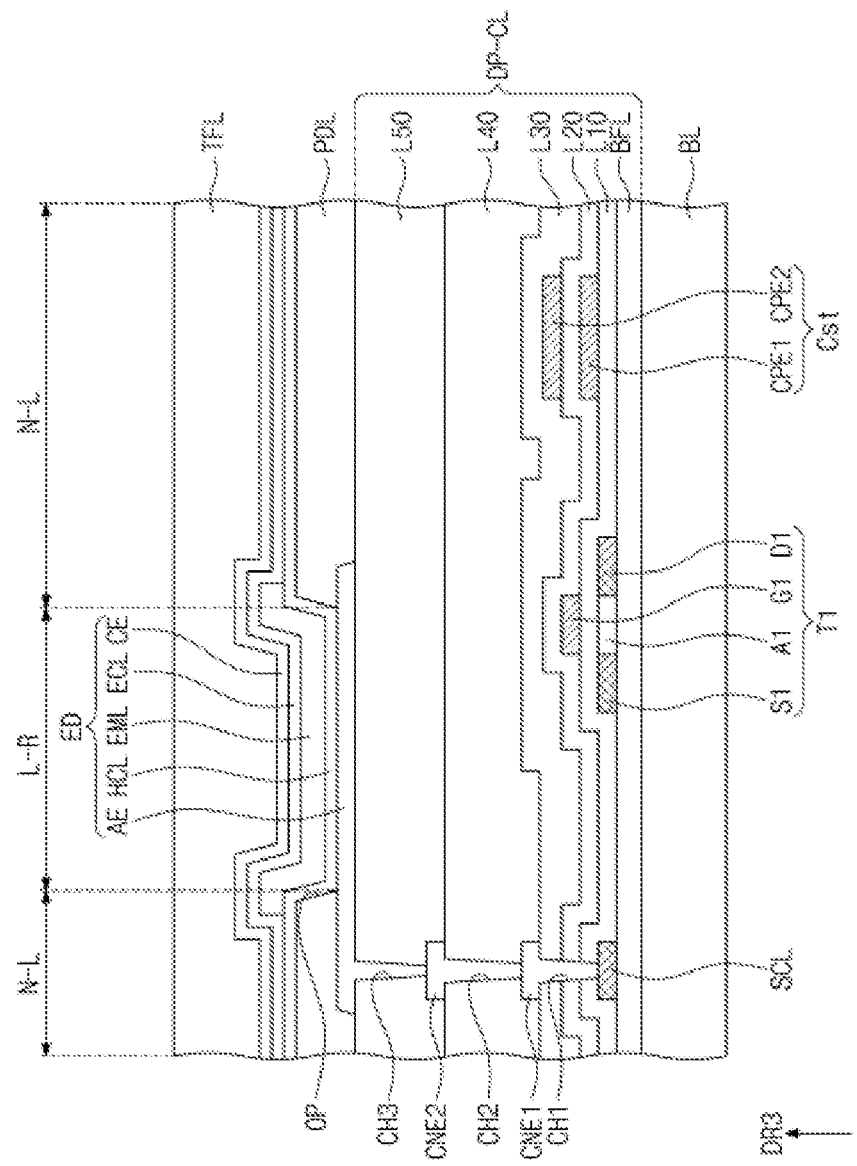
FIG. 8 is a cross-sectional view of the display panel of FIG. 2 corresponding to a first light emission area of light emission areas of FIG. 5A.

FIG. 8 is a cross-sectional view of the display panel DP corresponding to the first light emission area L-R of the light emission areas L-R, L-G, and L-B of FIG. 5A. FIG. 8 illustrates a cross-sectional view of the light emitting diode ED corresponding to the light emitting element and one first transistor T1 constituting the driving circuit DC.

The first transistor T1 and the light emitting diode ED are disposed on a base layer BL. The base layer BL may include a synthetic resin layer. A circuit element layer DP-CL is disposed on the base layer BL.

In this exemplary embodiment, the circuit element layer DP-CL may include a buffer layer BFL, a first intermediate inorganic layer L10, a second intermediate inorganic layer L20, and a third intermediate inorganic layer L30, which are inorganic layers, and a first intermediate organic layer L40 and a second intermediate organic layer L50, which are organic layers.

The semiconductor pattern is disposed on the buffer layer BFL. The semiconductor pattern may include a silicon semiconductor. The semiconductor pattern may include polysilicon. However, exemplary embodiments are not limited thereto, and the semiconductor pattern may include amorphous silicon. The semiconductor pattern may include a metal oxide semiconductor.

The semiconductor pattern has different electrical properties according to whether the semiconductor pattern is doped. The semiconductor pattern may include a doped region and a non-doped region. The doped region may be doped with an N-type dopant or a P-type dopant. The P-type transistor includes a doped region doped with the P-type dopant. The doped region may have conductivity greater than that of a non-doped region and substantially serve as an electrode or a signal line. The non-doped region may substantially correspond to an active (e.g., channel) of the transistor. In other words, a portion of the semiconductor pattern may be an active (e.g., channel) of the transistor, another portion may be a source (e.g., input electrode region) or a drain (e.g., output electrode region) of the transistor, and another portion may be a connection signal line (e.g., a connection electrode).

As illustrated in FIG. 8, a source S1, an active A1, and a drain D1 of the first transistor T1 are formed from a semiconductor pattern. In the exemplary embodiment illustrated in FIG. 7, since the first transistor T1 is a P-type transistor, the semiconductor pattern of the first transistor T1 may include a doped region doped with the P-type dopant. FIG. 8 illustrates a portion of a connection signal line SCL formed from the semiconductor pattern. For example, the connection signal line SCL may be connected to another transistor (e.g., a driving transistor) constituting the pixel driving circuit DC on a plane.

A control electrode G1 is disposed on the first intermediate inorganic layer L10 to overlap the active A1. A first capacitor electrode CPE1 of the capacitor Cst is disposed on the first intermediate inorganic layer L10. A second capacitor electrode CPE2 of the capacitor Cst is disposed on the second intermediate inorganic layer L20. An upper electrode UE overlapping the control electrode G1 is disposed on the second intermediate inorganic layer L20.

A first connection electrode CNE1 may be disposed on the third intermediate inorganic layer L30. A first connection electrode CNE1 may be connected to the connection signal line SCL through a first through-hole CH1. A second connection electrode CNE2 may be disposed on the first intermediate organic layer L40. The second connection electrode CNE2 may be connected to the first connection electrode CNE1 through a second through-hole CH2. For example, conductive patterns different from the first connection electrode CNE1 may be disposed on the third intermediate inorganic layer L30, and conductive patterns different from the second connection electrode CNE2 may be disposed on the first intermediate organic layer L40. The conductive patterns may constitute the signal line, for example, the data line DLi illustrated in FIG. 7.

The first electrode AE is disposed on the second intermediate organic layer L50. The first electrode AE may be connected to the second connection electrode CNE2 through a third through-hole CH3. A light emitting opening OP is defined in a pixel defining layer PDL. The light emitting opening OP of the pixel defining layer PDL exposes at least a portion of the first electrode AE.

The first display area DA1 (see FIG. 4) may include a light emission area L-R and a non-light emission area N-L adjacent to the light emission area L-R. The non-light emission area N-L may surround the light emission area L-R. In this exemplary embodiment, the light emission area L-R is defined to correspond to a partial area of the first electrode AE exposed by the light emitting opening OP. The non-light emission area N-L may be an area on which the driving circuit DC (see FIG. 7) is disposed.

A hole control layer HCL may be commonly disposed in the light emission area L-R and the non-light emission area N-L. The hole control layer HCL may include a hole transport layer and may further include a hole injection layer. The light emitting layer EML is disposed on the hole control layer HCL. The emission layer EML may be disposed on an area corresponding to the light emitting opening OP. For example, the light emitting layer EML may be formed to be separated from each of the pixels PX. The emission layer EML may include an organic material and/or an inorganic material. The emission layer EML may generate light having a predetermined color.

An electronic control layer ECL is disposed on the light emitting layer EML. The electron control layer ECL may include an electron transport layer and may further include an electron injection layer. The hole control layer HCL and the electron control layer ECL may be commonly formed in the plurality of pixels by using an open mask. The second electrode CE is disposed on the electron control layer ECL. The second electrode CE is commonly disposed in the plurality of pixels. An upper insulating layer TFL is disposed on the second electrode CE. The upper insulation layer TFL may include a plurality of thin films. The plurality of thin films may include an organic layer and/or an inorganic layer.

Referring again to FIGS. 5A, 5B, and 6, the first edge display area DA2_E1 and the first corner display area DA2 C1 will be described in more detail.

First, referring to FIGS. 5A and 5B, the first display area DA1 of the display panel DP includes a plurality of first unit areas UA1. For example, each of the plurality of first unit areas UA1 have the substantially same arrangement of the light emission areas. The plurality of first unit areas UA1 include a first light emission area L-R, a second light emission area L-G, and a third light emission area L-B. In this exemplary embodiment, each of the plurality of first unit areas UA1 includes one first light emission area L-R, two second light emission areas L-G, and one third light emission area L-B. The first light emission area L-R and the third light emission area L-B may be disposed in a line in the second direction DR2, and the two second light emission areas L-G may be disposed in a line in the second direction DR2. However, exemplary embodiments are not limited thereto. For example, the arrangement order and arrangement shape of the first to third light emission areas L-R, L-G, and L-B in each of the first unit areas UA1 may be variously changed. For example, the first light emission area L-R and the third light emission area L-B may be disposed in a line in the first direction DR1, and the two second light emission areas L-G are disposed in a line in a first direction DR1. According to another exemplary embodiment, the two second light emission areas L-G may be disposed to face each other in a diagonal direction between the first direction DR1 and the second direction DR2, and the first light emission area L-R and the third light emission area L-B may be disposed to face each other in the diagonal direction.

One of the two second light emission areas L-G may be defined as a fourth light emission area that is distinguished from the second light emission area L-G. For example, the second light emission area L-G and the fourth light emission area may have different planar shapes. The number and type of light emission areas provided in the plurality of first unit areas UA1 are not particularly limited thereto.

In this exemplary embodiment, the first light emission area L-R may generate red light as the first color light emission area. Each of the two second light emission areas L-G may generate green light as a second color light emission area. The third light emission area L-B may generate blue light as a third color light emission area. The red light, the green light, and the blue light may be changed to other three primary color lights.

The first edge display area DA2_E1 may include a first sub edge area (e.g., first sub area) SEA1 and a second sub edge area (e.g., second sub area) SEA2. The first sub edge area SEA1 is adjacent to the first display area DA1, and the second sub edge area SEA2 is adjacent to the first sub edge area SEA1. The second sub edge region SEA2 overlaps the first driving driver GDC1, e.g., in the third direction DR3 or in a plan view.

The first edge display area DA2_E1 includes a plurality of second unit areas UA2. For example, each of the plurality of second unit areas UA2 have the substantially same arrangement of the light emission areas. The plurality of second unit areas UA2 include a first light emission area L-R, a second light emission area L-G, and a third light emission area L-B. In this exemplary embodiment, each of the plurality of second unit areas UA2 may have the substantially same arrangement of the light emission areas as each of the plurality of first unit areas UA1.

The first sub edge area SEA1 may include the driving circuit DC corresponding to the first light emission area L-R, the second light emission area L-G, and the third light emission area L-B, but the second sub edge area SEA2 may not include the driving circuit DC corresponding to the first light emission area L-R, the second light emission area L-G, and the third light emission area L-B.

Since the first light emission area L-R, the second light emission area L-G, and the third light emission area L-B inside the second sub edge area SEA2 overlap the first driving driver GDC1 in a plan view, the driving circuit DC corresponding to the first light emission area L-R, the second light emission area L-G, and the third light emission area L-B inside the second sub edge area SEA2 is disposed on the first sub edge area SEA1.

In other words, the driving circuits DC corresponding to the first light emission area L-R, the second light emission area L-G, and the third light emission area L-B inside the first sub edge area SEA1 and the driving circuits DC corresponding to the first light emission area L-R, the second light emission area L-G, and the third light emission area L-B inside the second sub edge area SEA2 may be disposed on the first sub edge area SEA1.

The light emitting diodes corresponding to the first light emission area L-R, the second light emission area L-G, and the third light emission area L-B of the second sub edge area SEA2 may be electrically connected to the corresponding driving circuit DC disposed on the first sub edge area SEA1.

Each of the second unit areas UA2 may have a surface area (e.g., in a plan view) greater than that of each of the first unit areas UA1. For example, the first light emission area L-R inside each of the second unit areas UA2 may have a surface area (e.g., in a plan view) greater than that of the first light emission area L-R inside each of the first unit areas UA1. The second light emission area L-G inside each of the second unit areas UA2 may have a surface area (e.g., in a plan view) greater than that of the second light emission area L-G inside each of the first unit areas UA1. The third light emission area L-B inside each of the second unit areas UA2 may have a surface area (e.g., in a plan view) greater than that of the third light emission area L-B inside each of the first unit areas UA1. When the light emission areas are different between the corresponding light emitting elements, and the same driving voltage is applied to the corresponding light emitting elements, a luminance ratio of the corresponding light emitting elements depends on a light emission area ratio.

Since each of the second unit areas UA2 has a surface area (e.g., in a plan view) larger than that of each of the first unit areas UA1, the number of light emission areas per unit surface area on the first display areas DA1 is greater than that of light emission areas per unit surface area on the first edge display area DA2_E1. The unit surface area may have a surface area (e.g., in a plan view) larger than that of each of the second unit areas UA2. For example, the unit surface area may be set to have a surface area (e.g., in a plan view) than twice or three times the surface area of each of the second unit areas UA2.

Since the number of light emission areas per unit surface area in the first edge display area DA2_E1 is less than that of light emission areas per unit surface area on the first display area DA1, when the same emission surface area and the same driving condition are satisfied, the first edge display area DA2_E1 may have luminance per unit surface area less than that of the first display area DA1. The same emission surface area means that the surface areas of the corresponding the light emission areas of each of the first unit areas UA1 and the second unit areas UA2 are substantially the same. The same driving condition means that the substantially same driving voltage is applied to the light emitting element.

According to this exemplary embodiment, to compensate a difference in luminance between the first edge display area DA2_E1 and the first display area DA1, each of the first, second, and third light emission areas L-R, L-G, and L-B of the first edge display area DA2_E1 may have a surface area (e.g., in a plan view) greater than that of the corresponding light emission area of the first, second, and third light emission areas L-R, L-G, and L-B of the first display area DA1. When the light emission areas are different between the corresponding light emitting elements, and the substantially same driving voltage is applied to the corresponding light emitting elements, a luminance ratio of the corresponding light emitting elements depends on a light emission area ratio.

In this exemplary embodiment, the first light emission area L-R of the first edge display area DA2_E1 has a surface area (e.g., in a plan view) greater about four times than that of the first light emission area L-R of the first display area DA1, and the second light emission area L-G of the first edge display area DA2_E1 has a surface area (e.g., in a plan view) greater about four times than that of the second light emission area L-G of the first display area DA1, and the third light emission area L-B of the first edge display area DA2_E1 has a surface area (e.g., in a plan view) greater about four times than that of the third light emission area L-B of the first display area DA1. As a result, in the surface area of the corresponding light emission area per unit surface area, the first display area DA1 and the first edge display area DA2_E1 may have the substantially same surface area.

A lifespan of the light emitting element may be determined according to initial luminance and an acceleration coefficient. The acceleration coefficient is affected by a temperature, device characteristics, and material characteristics. The surface area of the first edge display area DA2_E1 may increase so that the surface area of the total light emission area per unit surface area increases to correspond to the surface area of the light emission area per unit surface area of the first display area DA1. In addition, as the emission luminance per unit surface area on the first edge display area DA2_E1 is increased, the initial luminance of the light emission area of the first edge display area DA2_E1 may be decreased. Thus, the desired lifespan of the light emitting element of the first edge display area DA2_E1 may be substantially the same as that of the light emitting element of the first display area DA1.

Referring to FIG. 6, at least a portion of a first corner display area DA2_C1 has a curved shape. A portion of an outer circumference of the first corner display area DA2_C1 may have a shape of a first curved pattern CP1. The first curved pattern CP1 may have a predetermined curvature. The shape and curvature of the first curved pattern CP1 may be variously changed.

The first, second, and third light emission areas L-R, L-G, and L-B of the first corner display area DA2_C1 may be provided in a stair shape along a curve of the first curved pattern CP1. For example, the first, second, and third light emission areas L-R, L-G, L-B are provided in the stair shape on the area adjacent to the first curved pattern CP1 of the first corner display area DA2_C1, and the first, second, and third light emission areas L-R, L-G, and L-B may be provided in the substantially same shape as the first, second, and third light emission areas L-R, L-G, and L-B inside the first display area DA1 on the remaining area of the first corner display area DA2_C1.

The first corner display area DA2_C1 may include a first sub corner area SCA1 and a second sub corner area SCA2. The first sub corner area SCA1 is adjacent to the first display area DA1, and the second sub corner area SCA2 is adjacent to the first sub corner area SCA1. The second sub corner area SCA2 overlaps the first driving driver GDC1 in a plan view.

Referring to FIG. 6, the entire first display area DA1 may have a uniform width (i.e., W_U1=W_L1) in the first direction DR1. A width of the first corner display area DA2_C1 in the first direction DR1 may be gradually narrowed as moving from the first edge display area DA2_E1 (see FIG. 4) in the second direction DR2. For example, a width of the first sub corner area SCA1 in the first direction DR1 may be gradually narrowed as moving from the first edge display area DA2_E1 in the second direction DR2 (i.e., W_U2>W_L2). Similarly, a width of the second sub corner area SCA2 in the first direction DR1 may be gradually narrowed as moving from the first edge display area DA2_E1 in the second direction DR2 (i.e., W_U3>W_L3).

The width of each of the first sub corner area SCA1 and the second sub corner area SCA2 may be changed according to the curvature of the first curved pattern CP1. For example, the width of the second sub corner area SCA2 in the first direction DR1 may be gradually narrowed as moving from the first edge display area DA2_E1 in the second direction DR2, but the width of the first sub corner area SCA1 may be uniformly maintained.

Figure 9A:
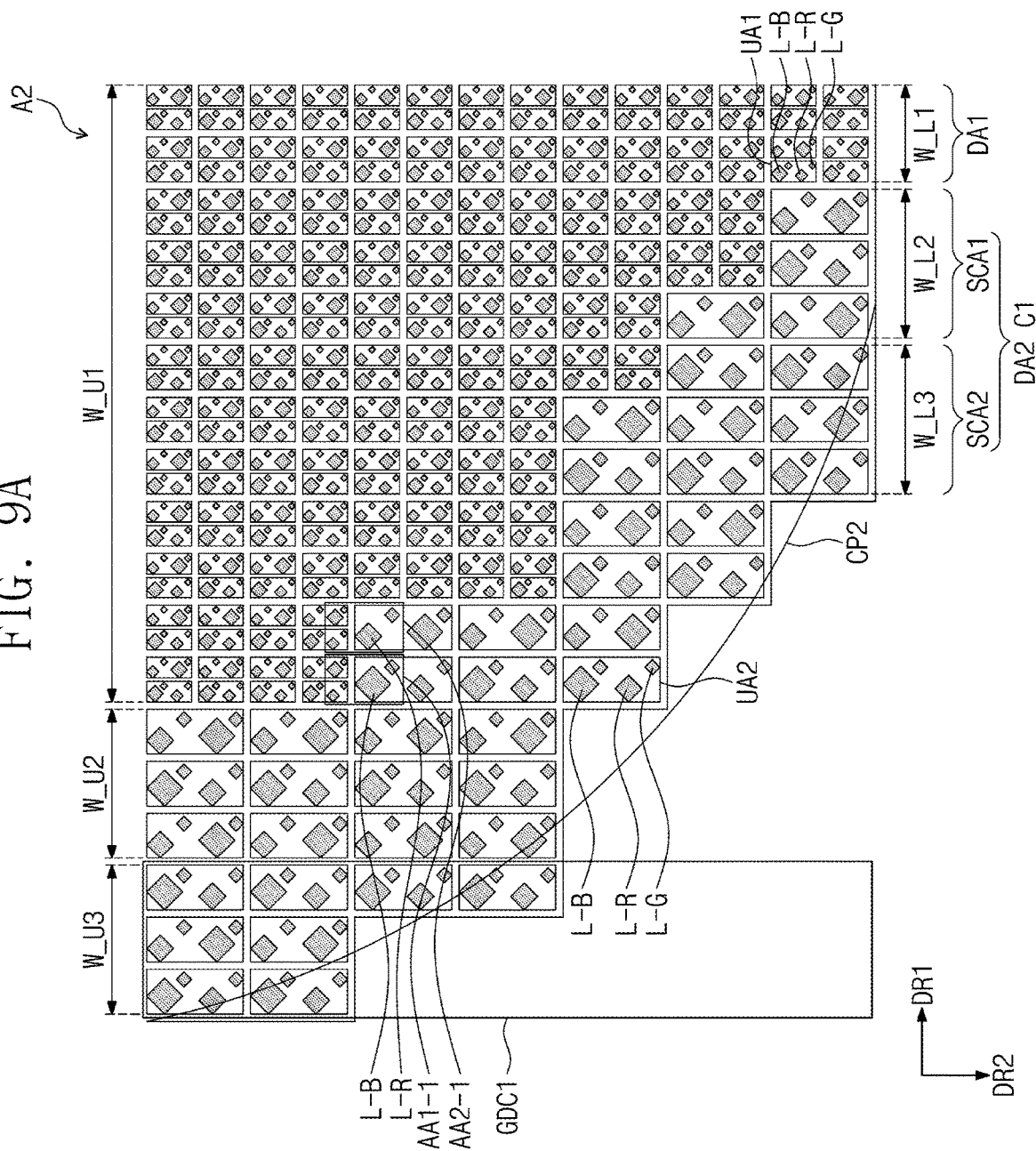
FIGS. 9A, 9B, and 9C are enlarged plan views of an area A2 of FIG. 4 illustrating other exemplary embodiments of the display panel of FIG. 2.
Figure 9B:
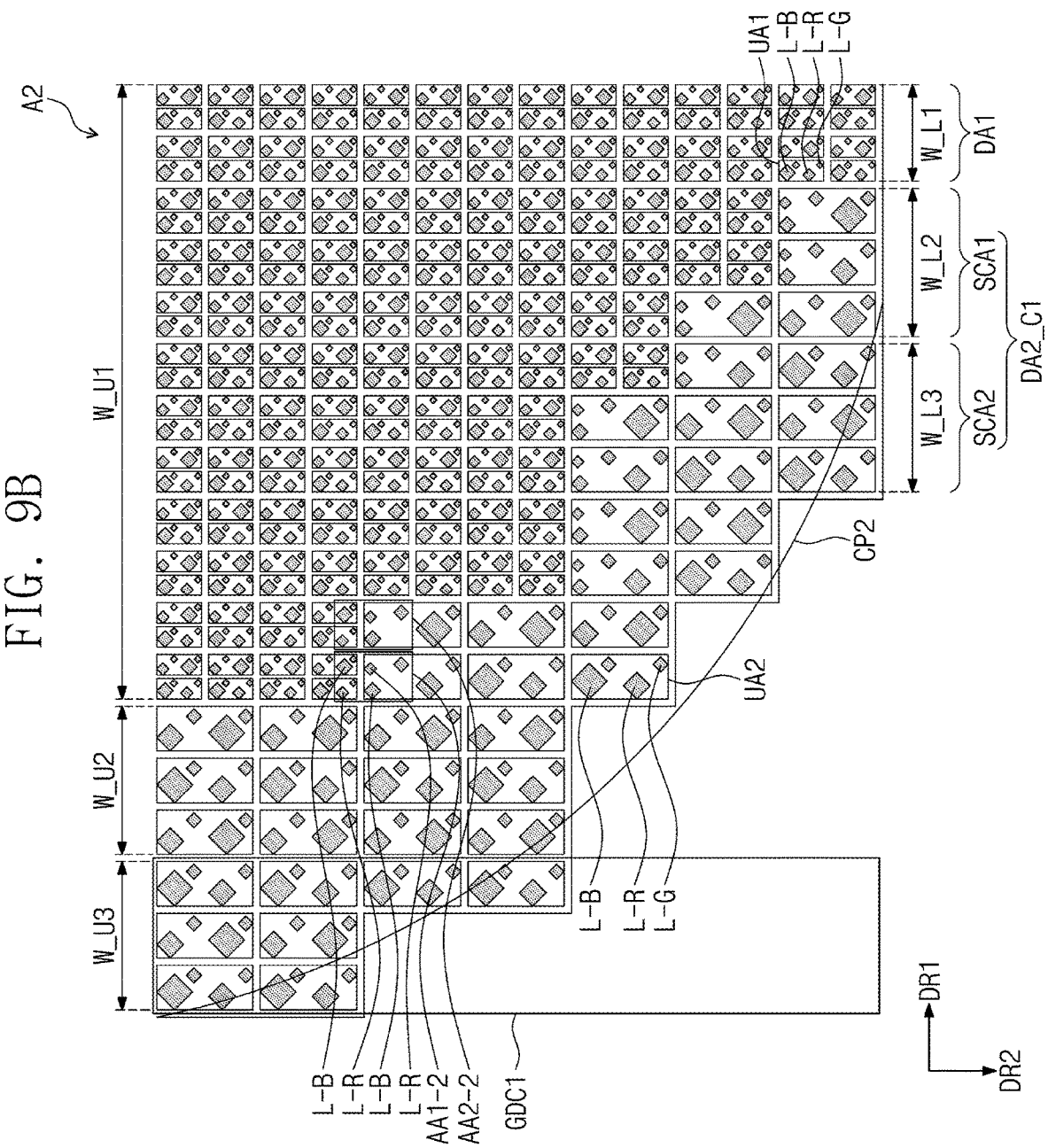
Figure 9C:
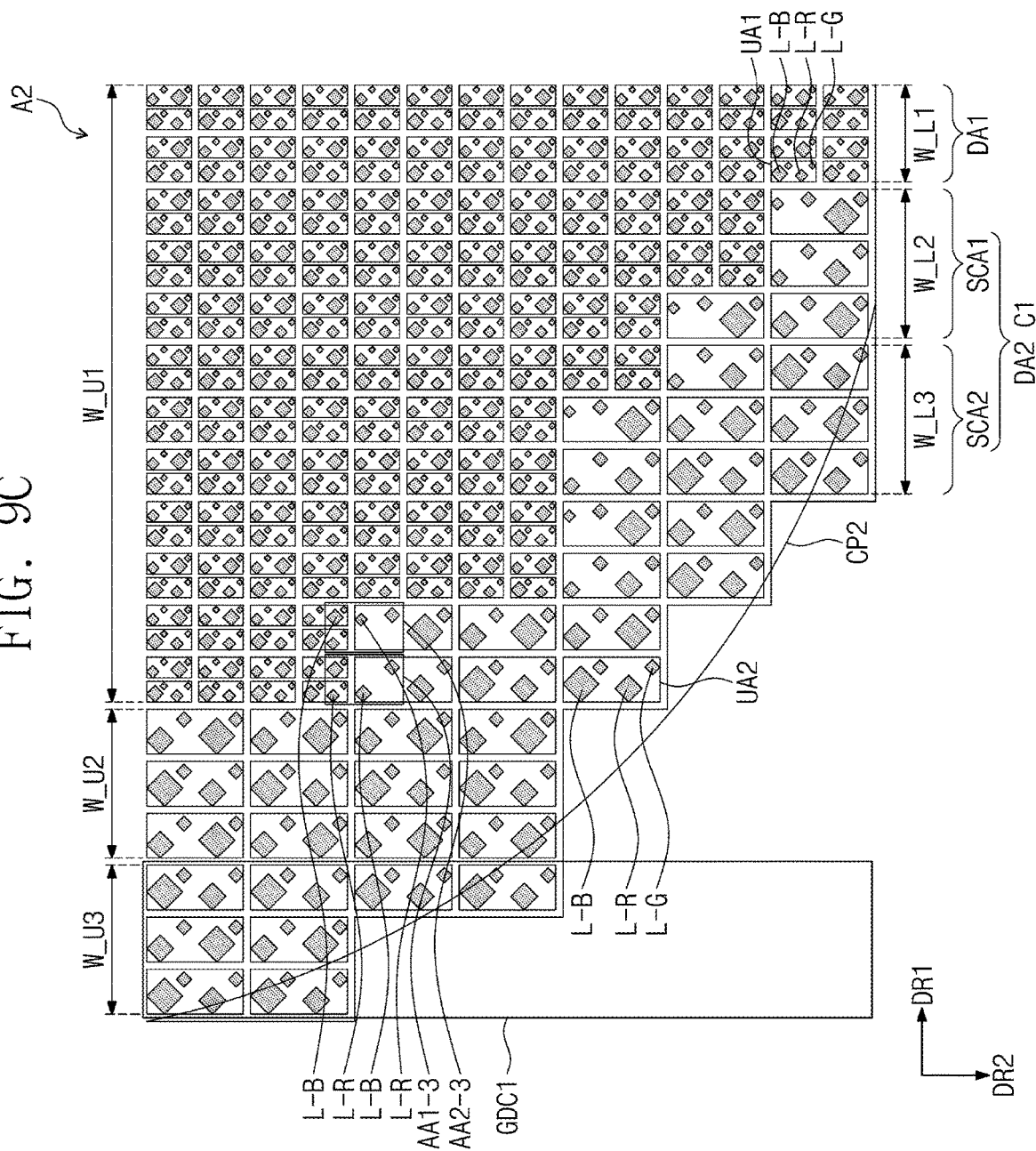

FIGS. 9A, 9B, and 9C are enlarged plan views of an area A2 of FIG. 4 illustrating other exemplary embodiments of the display panel of FIG. 2.

As illustrated in FIG. 9A, at least a portion of the first corner display area DA2_C1 has a curved shape. A portion of an outer circumference of the first corner display area DA2_C1 may have a shape of a second curved pattern CP2. The second curved pattern CP2 may have a predetermined curvature.

The first corner display area DA2_C1 may include a first sub corner area SCA1 and a second sub corner area SCA2. The first sub corner area SCA1 is adjacent to the first display area DA1, and the second sub corner area SCA2 is adjacent to the first sub corner area SCA1. The second sub corner area SCA2 overlaps the first driving driver GDC1 in a plan view.

A width of the first display area DA1 in the first direction DR1 may be gradually narrowed as moving from the area corresponding to the first edge display area DA2_E1 (see FIG. 4) in the second direction DR2 (i.e., W_U1>W L1). A width of the first corner display area DA2_C1 in the first direction DR1 may be substantially constant. For example, the width of the first sub corner area SCA1 in the first direction DR1 is substantially constant throughout the first sub corner area SCA1 (i.e., W_U2=W_L2). Similarly, the width of the second sub corner area SCA2 in the first direction DR1 is substantially constant throughout the second sub corner area SCA2 (i.e., W_U3=W_L3).

Although the width of each of the first sub corner area SCA1 and the second sub corner area SCA2 in the first direction DR1 is substantially constant, since the width of the first display area DA1 in the first direction DR1 is gradually narrowed as moving from the area corresponding to the first edge display area DA2_E1 in the second direction DR2, the first corner display area DA2_C1 may be disposed along the second curved pattern CP2.

The plurality of second unit areas UA2 of the first corner display area DA2_C1 may be disposed in a stair shape along a curve of the second curved pattern CP2. For example, the plurality of second unit areas UA2 are disposed in the stair shape on the area adjacent to the second curved pattern CP2 of the first corner display area DA2_C1, and the plurality of second unit areas UA2 may be disposed in a matrix form on the remaining area of the first corner display area DA2_C1.

In the exemplary embodiment illustrated in FIG. 6, the first, second, and third light emission areas L-R, L-G, and L-B of the first corner display area DA2_C1 may be provided in a stair shape along a curve of the first curved pattern CP1. Accordingly, the first, second, and third light emission areas L-R, L-G, and L-B may be disposed in a shape similar to that of the first curved pattern CP1.

In the exemplary embodiment illustrated in FIG. 9A, the second unit areas UA2 of the first corner display area DA2_C1 may be disposed in a stair shape along a curve of the second curved pattern CP2. One second unit area UA2 may include one first light emission area L-R, two second light emission areas L-G, and one third light emission area L-B and be a minimum unit constituting an image. According to the exemplary embodiment of FIG. 9A, each of the second unit areas UA2 that is the minimum unit constituting an image may be disposed in a stair shape along a curve of the second curved pattern CP2 to minimize distortion of the image.

The first unit areas UA1 may be disposed on an area adjacent to the first sub corner area SCA1 of the first display area DA1. One first unit area UA1 may include one first light emission area L-R, two second light emission areas L-G, and one third light emission area L-B and be a minimum unit constituting an image. According to the exemplary embodiment of FIG. 9A, the distortion of the image may be minimized by disposing the first unit areas UA1, which is the minimum unit constituting the image, in the stair shape so as to be adjacent to the first sub corner area SCA1.

In FIG. 9A, an area AA1-1 may be a portion at which the first display area DA1 and the first corner display area DA2_C1 are adjacent to each other in the second direction DR2. As a surface area of the third light emission area L-B significantly increases at a boundary between the first display area DA1 and the first corner display area DA2_C1, a ratio of blue light generated from the third light emission area L-B on the area AA1-1 increases when compared to the first display area DA1. Similarly, a ratio of red light generated from the first light emission area L-R on an area AA1-2 increases when compared to the first display area DA1. As a ratio of specific light increases, the image may be displayed to be distorted.

Referring to FIG. 9B, a surface area of each of the first light emission area L-R and the third light emission area L-B at a portion adjacent to the first display area DA1 in the second direction DR2 on the first corner display area DA2_C1 may decrease to be substantially the same as that of each of the first light emission area L-R and the third light emission area L-B of the first display area DA1. In addition, the number of each of the first light emission area L-R and the third light emission area L-B at portion adjacent to the first display area DA1 in the second direction DR2 on the first corner display area DA2_C1 may be substantially the same as that of each of the first light emission area L-R and the third light emission area L-B of the first display area DA1. Thus, a ratio of each of red light generated from the first light emission area L-R and blue light generated from the third light emission area L-B on the area AA1-2 may be similar to that of red light generated from the first light emission area L-R and blue light generated from the third light emission area L-B inside the first unit areas UA1 of the first display area DA1.

Similarly, a ratio of each of red light generated from the first light emission area L-R and blue light generated from the third light emission area L-B on an area AA2-2 may be similar to that of red light generated from the first light emission area L-R and blue light generated from the third light emission area L-B inside the first unit areas UA1 of the first display area DA1. As a result, distortion of an image may be minimized at a portion at which the first display area DA1 and the first corner display area DA2_C1 are adjacent to each other in the second direction DR2.

Referring to FIG. 9C, a surface area of each of the first light emission area L-R and the third light emission area L-B at a portion adjacent to the first display area DA1 in the second direction DR2 on the first corner display area DA2_C1 may decrease to be substantially the same as that of each of the first light emission area L-R and the third light emission area L-B of the first display area DA1. Thus, luminance of blue light generated from the third light emission area L-B in an area AA1-3 may decrease when compared to that on the area AA1-1 illustrated in FIG. 9A. In addition, luminance of red light generated from the first light emission area L-R on an area AA2-3 may decrease when compared to that on the area AA2-1 illustrated in FIG. 9A. As a result, distortion of an image may be minimized at a portion at which the first display area DA1 and the first corner display area DA2_C1 are adjacent to each other in the second direction DR2.

Figure 10:
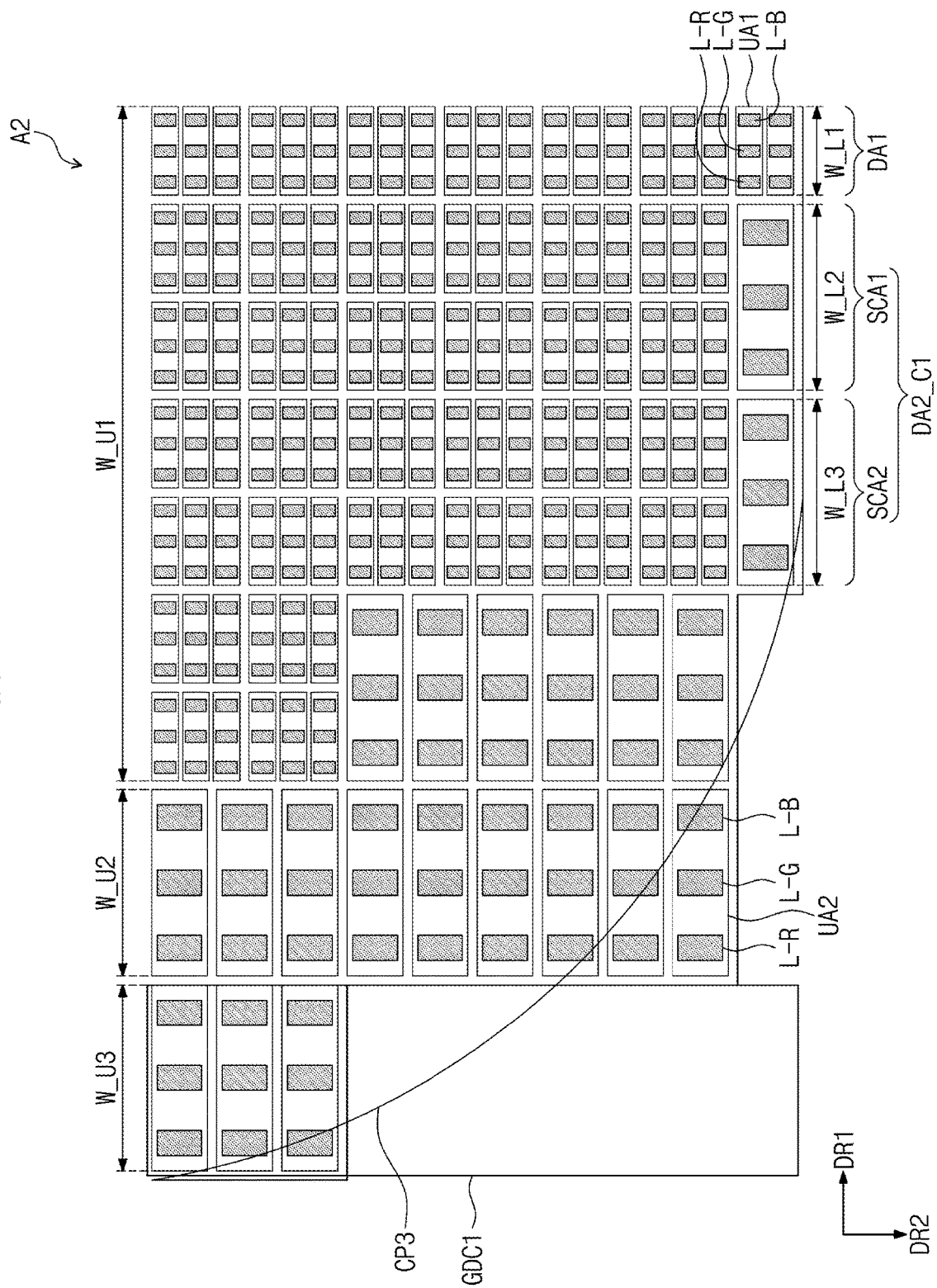
FIG. 10 is an enlarged plan view of an area A2 of FIG. 4 illustrating another exemplary embodiment of the display panel of FIG. 2.

FIG. 10 is an enlarged plan view of the area A2 of FIG. 4 illustrating another exemplary embodiment of the display panel of FIG. 2.

As illustrated in FIG. 10, a plurality of first unit areas UA1 may be defined on a first display area DA1, and a plurality of second unit areas UA2 may be defined on a first corner display area DA2_C1. The plurality of first unit areas UA1 and the plurality of second unit areas UA2 may be disposed in a matrix form along the first direction DR1 and the second direction DR2.

Each of the first unit areas UA1 and the second unit areas UA2 may include one first light emission area L-R, one second light emission area L-G, and one third light emission area L-B.

At least a portion of the first corner display area DA2_C1 has a curved shape. A portion of the outer circumference of the first corner display area DA2_C1 may have a shape of a third curved pattern CP3. The third curved pattern CP3 may have a predetermined curvature.

The first corner display area DA2_C1 may include a first sub corner area SCA1 and a second sub corner area SCA2. The first sub corner area SCA1 is adjacent to the first display area DA1, and the second sub corner area SCA2 is adjacent to the first sub corner area SCA1. The second sub corner area SCA2 overlaps the first driving driver GDC1 in a plan view.

A width of the first display area DA1 in the first direction DR1 may be gradually narrowed as moving from the area corresponding to the first edge display area DA2_E1 (see FIG. 4) in the second direction DR2 (i.e., W_U1>W_L1). A width of the first corner display area DA2_C1 in the first direction DR1 may be substantially constant. For example, the width of the first sub corner area SCA1 in the first direction DR1 is substantially constant throughout the first sub corner area SCA1 (i.e., W_U2=W_L2). Similarly, the width of the second sub corner area SCA2 in the first direction DR1 is substantially constant throughout the second sub corner area SCA2 (i.e., W_U3=W_L3).

Although the width of each of the first sub corner area SCA1 and the second sub corner area SCA2 in the first direction DR1 is substantially constant, since the width of the first display area DA1 in the first direction DR1 is gradually narrowed as moving from the area corresponding to the first edge display area DA2_E1 in the second direction DR2, the first corner display area DA2_C1 may be disposed along the third curved pattern CP3.

The plurality of second unit areas UA2 of the first corner display area DA2_C1 may be disposed in a stair shape along a curve of the third curved pattern CP3. For example, the plurality of second unit areas UA2 are disposed in the stair shape on the area adjacent to the third curved pattern CP3 of the first corner display area DA2_C1, and the plurality of second unit areas UA2 may be disposed in a matrix form on the remaining area of the first corner display area DA2_C1.

In the exemplary embodiment illustrated in FIG. 10, one second unit area UA2 may include one first light emission area L-R, one second light emission area L-G, and one third light emission area L-B and be a minimum unit constituting an image. Each of the second unit areas UA2 that is the minimum unit constituting an image may be disposed in a stair shape along a curve of the third curved pattern CP3 to minimize distortion of the image.

The first unit areas UA1 may be disposed on an area adjacent to the first sub corner area SCA1 of the first display area DA1. One first unit area UA1 may include one first light emission area L-R, one second light emission area L-G, and one third light emission area L-B and be a minimum unit constituting an image. The distortion of the image may be minimized by disposing the first unit areas UA1, which is the minimum unit constituting the image, in the stair shape so as to be adjacent to the first sub corner area SCA1.

Figure 11:
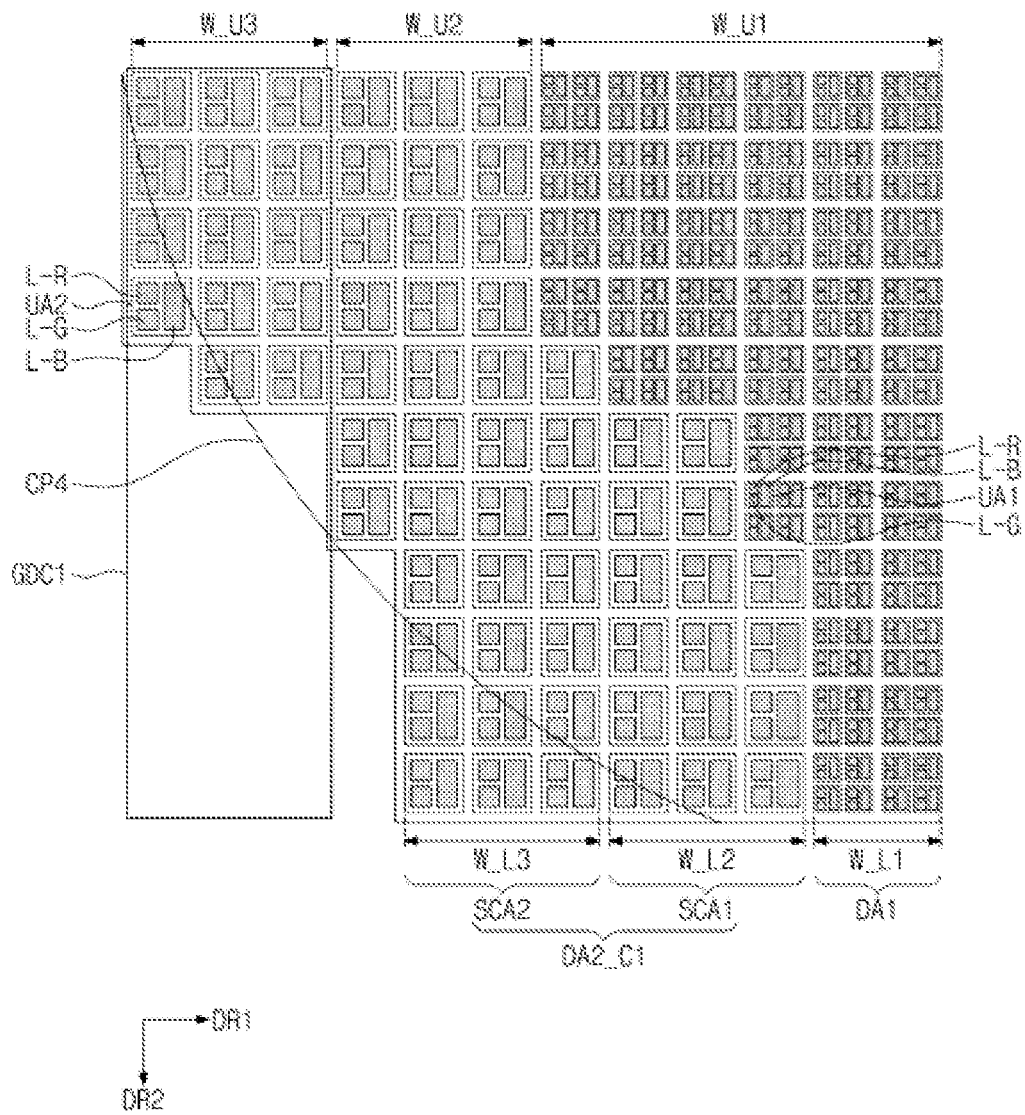
FIG. 11 is an enlarged plan view of the area A2 of FIG. 4 illustrating another exemplary embodiment of the display panel of FIG. 2.

FIG. 11 is an enlarged plan view of the area A2 of FIG. 4 illustrating another exemplary embodiment of the display panel of FIG. 2.

As illustrated in FIG. 11, a plurality of first unit areas UA1 may be defined on a first display area DA1, and a plurality of second unit areas UA2 may be defined on a first corner display area DA2 C1. The plurality of first unit areas UA1 and the plurality of second unit areas UA2 may be disposed in a matrix form along the first direction DR1 and the second direction DR2.

Each of the first unit areas UA1 and the second unit areas UA2 may include one first light emission area L-R, one second light emission area L-G, and one third light emission area L-B. The first light emission area L-R and the second light emission area L-G may have the substantially same surface area, e.g., in a plan view, and the third light emission area L-B may be greater than the first light emission area L-R.

At least a portion of the first corner display area DA2_C1 has a curved shape. A portion of the outer circumference of the first corner display area DA2_C1 may have a shape of a fourth curved pattern CP4. The fourth curved pattern CP4 may have a predetermined curvature.

The first corner display area DA2_C1 may include a first sub corner area SCA1 and a second sub corner area SCA2. The first sub corner area SCA1 is adjacent to the first display area DA1, and the second sub corner area SCA2 is adjacent to the first sub corner area SCA1. The second sub corner area SCA2 overlaps the first driving driver GDC1 in a plan view.

A width of the first display area DA1 in the first direction DR1 may be gradually narrowed as moving from the area corresponding to the first edge display area DA2_E1 (see FIG. 4) in the second direction DR2 (i.e., W_U1>W_L1). A width of the first corner display area DA2_C1 in the first direction DR1 may be substantially constant. For example, the width of the first sub corner area SCA1 in the first direction DR1 is substantially constant throughout the first sub corner area SCA1 (i.e., W_U2=W_L2). Similarly, the width of the second sub corner area SCA2 in the first direction DR1 is substantially constant throughout the second sub corner area SCA2 (i.e., W_U3=W_L3).

Although the width of each of the first sub corner area SCA1 and the second sub corner area SCA2 in the first direction DR1 is substantially constant, since the width of the first display area DA1 in the first direction DR1 is gradually narrowed as moving from the area corresponding to the first edge display area DA2_E1 in the second direction DR2, the first corner display area DA2_C1 may be disposed along the fourth curved pattern CP4.

The plurality of second unit areas UA2 of the first corner display area DA2_C1 may be disposed in a stair shape along a curve of the fourth curved pattern CP4. For example, the plurality of second unit areas UA2 are disposed in the stair shape on the area adjacent to the fourth curved pattern CP4 of the first corner display area DA2_C1, and the plurality of second unit areas UA2 may be disposed in a matrix form on the remaining area of the first corner display area DA2_C1.

In the exemplary embodiment illustrated in FIG. 11, one second unit area UA2 may include one first light emission area L-R, one second light emission area L-G, and one third light emission area L-B and be a minimum unit constituting an image. Each of the second unit areas UA2 that is the minimum unit constituting an image may be disposed in a stair shape along a curve of the fourth curved pattern CP4 to minimize distortion of the image.

The first unit areas UA1 may be disposed on an area adjacent to the first sub corner area SCA1 of the first display area DA1. One first unit area UA1 may include one first light emission area L-R, one second light emission area L-G, and one third light emission area L-B and be a minimum unit constituting an image. The distortion of the image may be minimized by disposing the first unit areas UA1, which is the minimum unit constituting the image, in the stair shape so as to be adjacent to the first sub corner area SCA1.

The display device having the above-described configuration may display the image on the area having the curvature of the display panel. In addition, the pixels may be disposed along the curved surface of the display area to prevent the image from being distorted.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device comprising:
   a window comprising a front area and a side area bent from the front area, the side area having a first curvature; and
   a display panel comprising a first display area facing the front area of the window and a second display area facing the side area of the window, the first display area comprising a first light emission area, a second light emission area, and a third light emission area, the second display area comprising a first light emission area, a second light emission area, and a third light emission area,
   wherein the second display area comprises an edge display area and a corner display area disposed at an end of the edge display area, and
   the first light emission area, the second light emission area, and the third light emission area of the corner display area are disposed in a stair shape along a curved edge of the corner display area.

2. The display device of claim 1, wherein:
   the first light emission area of the second display area has a surface area greater than that of the first light emission area of the first display area,
   the second light emission area of the second display area has a surface area greater than that of the second light emission area of the first display area, and
   the third light emission area of the second display area has a surface area greater than that of the third light emission area of the first display area.

3. The display device of claim 1, wherein the second display area comprises a first sub area adjacent to the first display area and a second sub area adjacent to the first sub area.

4. The display device of claim 3, wherein the display panel further comprises a driving driver disposed on the second display area, and
a portion of the second sub area overlaps the driving driver in a plan view.

5. The display device of claim 4, wherein the display panel further comprises:
first light emitting elements and first driving circuits configured to control the first, second, and third light emission areas of the first display area; and
second light emitting elements and second driving circuits configured to control the first, second, and third light emission areas of the second display area,
wherein the second driving circuits are disposed on the first sub area.

6. The display device of claim 5, wherein the first, second, and third light emission areas of the second sub area inside the second display area overlap the driving driver in a plan view.

7. The display device of claim 5, wherein each of the second driving circuits has a surface area greater than that of each of the first driving circuits.

8. The display device of claim 1, wherein a width of the corner display area in a first direction inside the second display area is gradually narrowed as moving from the edge display area in a second direction intersecting the first direction.

9. The display device of claim 1, wherein a width of the corner display area in a first direction inside the second display area is substantially constant as moving in a second direction intersecting the first direction, and
a width of a portion of the first display area overlapping the side area of the window in the first direction is gradually narrowed as moving in the second direction.

10. A display device comprising:
a window comprising a front area and a side area bent from the front area, the side area having a first curvature; and
a display panel on the window, the display panel comprising a first display area facing the front area of the window and a second display area facing the side area of the window, the second display area comprising an edge display area and a corner display area disposed at an end of the edge display area, wherein:
the first display area comprises a plurality of first unit areas, each of the first unit areas comprising a first light emission area, a second light emission area, and a third light emission area, and
the second display area comprises a plurality of second unit areas, each of the second unit areas comprising a first light emission area, a second light emission area, and a third light emission area, and wherein:
each of the plurality of second unit areas has a surface area greater than that of each of the plurality of first unit areas, and
the plurality of second unit areas are disposed in a stair shape along a curved edge of the corner display area.

11. The display device of claim 10, wherein the second display area comprises a first sub area adjacent to the first display area and a second sub area adjacent to the first sub area.

12. The display device of claim 11, wherein the display panel further comprises a driving driver disposed on the second display area, and
a portion of the second sub area overlaps the driving driver in a plan view.

13. The display device of claim 10, wherein a width of the corner display area in a first direction inside the second display area is gradually narrowed as moving from the edge display area in a second direction intersecting the first direction.

14. The display device of claim 10, wherein a width of the corner display area in a first direction inside the second display area is substantially constant as moving in a second direction intersecting the first direction, and
a width of a portion of the first display area overlapping the side area of the window in the first direction is gradually narrowed as moving in the second direction.

15. The display device of claim 10, wherein each of the plurality of first unit areas and the plurality of second unit areas further comprises a fourth light emission area.

16. The display device of claim 15, wherein two light emission areas of the first, second, third, and fourth light emission areas of each of the plurality of first unit areas and the plurality of second unit areas generate light having a substantially same color.

17. A display panel comprises:
a first display area comprising a plurality of first unit areas, each of the plurality of first unit areas comprising a first light emission area, a second light emission area, and a third light emission area; and
a second display area adjacent to the first display area, the second display area comprising an edge display area and a corner display area disposed at an end of the edge display area, wherein:
the second display area comprises a plurality of second unit areas, each of the plurality of second unit areas comprising a first light emission area, a second light emission area, and a third light emission area,
each of the plurality of second unit areas has a surface area greater than that of each of the plurality of first unit areas, and
the plurality of second unit areas are disposed in a stair shape along a curved edge of the corner display area.

18. The display panel of claim 17, wherein the second display area comprises a first sub area adjacent to the first display area and a second sub area adjacent to the first sub area.

19. The display panel of claim 18, further comprising:
first light emitting elements and first driving circuits configured to control the first, second, and third light emission areas of the first display area; and
second light emitting elements and second driving circuits configured to control the first, second, and third light emission areas of the second display area,
wherein the second driving circuits are disposed on the first sub area.

20. The display panel of claim 17, wherein a width of the corner display area in a first direction inside the second display area is substantially constant as moving in a second direction intersecting the first direction, and
a width of a portion of the first display area adjacent to the second display area in the first direction is gradually narrowed as moving in the second direction.

* * * * *